United States Patent
Kang

(10) Patent No.: US 7,625,822 B2
(45) Date of Patent: Dec. 1, 2009

(54) SEMICONDUCTOR DEVICE AND METHOD FOR MANUFACTURING THE SAME INCLUDING TWO ANTIREFLECTIVE COATING FILMS

(75) Inventor: Jae Hyun Kang, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 153 days.

(21) Appl. No.: 11/320,624

(22) Filed: Dec. 30, 2005

(65) Prior Publication Data

US 2007/0059937 A1    Mar. 15, 2007

(30) Foreign Application Priority Data

Sep. 13, 2005    (KR)  ........................ 10-2005-0085162

(51) Int. Cl.
*H01L 21/311*    (2006.01)
*H01L 21/302*    (2006.01)
*H01L 21/461*    (2006.01)

(52) U.S. Cl. ........................... 438/703; 438/717; 216/5; 216/41

(58) Field of Classification Search ................ 438/717, 438/758, 778, 780, 730; 216/41, 59, 5; 257/E21
See application file for complete search history.

(56) References Cited

U.S. PATENT DOCUMENTS

| | | | | |
|---|---|---|---|---|
| 6,423,474 | B1* | 7/2002 | Holscher | .................... 430/312 |
| 6,630,397 | B1* | 10/2003 | Ding et al. | ................... 438/636 |
| 6,780,708 | B1* | 8/2004 | Kinoshita et al. | ........... 438/241 |
| 6,995,437 | B1* | 2/2006 | Kinoshita et al. | ........... 257/391 |
| 2005/0186754 | A1* | 8/2005 | Kim | ........................... 438/401 |
| 2006/0263699 | A1* | 11/2006 | Abatchev et al. | ............... 430/5 |
| 2007/0049039 | A1* | 3/2007 | Jang et al. | .................... 438/706 |
| 2007/0093070 | A1* | 4/2007 | Ghandehari et al. | ......... 438/717 |
| 2007/0122753 | A1* | 5/2007 | Jang | ........................... 430/316 |

\* cited by examiner

*Primary Examiner*—William M. Brewster
(74) *Attorney, Agent, or Firm*—Finnegan, Henderson, Farabow, Garrett, & Dunner, L.L.P.

(57) ABSTRACT

A method for manufacturing a semiconductor device deposits a plurality of bottom antireflective coating films to prevent a standing wave caused by a light source of a short wavelength in forming a fine pattern. The method includes forming a pattern formation layer on an entire surface of a wafer, forming two or more bottom antireflective coating films on the pattern formation layer, forming a photoresist film pattern on a predetermined region of the bottom antireflective coating films, etching the bottom antireflective coating films using the photoresist film pattern as a mask, forming sidewall spacers at sides of the photoresist film pattern, and etching the pattern formation layer using the sidewall spacers and the photoresist film pattern as masks.

5 Claims, 5 Drawing Sheets

SEMICONDUCTOR DEVICE AND METHOD FOR MANUFACTURING THE SAME INCLUDING TWO ANTIREFLECTIVE COATING FILMS

This application claims the benefit of Korean Patent Application No. P2005-0085162, filed on Sep. 13, 2005, which is hereby incorporated by reference in its entirety.

BACKGROUND

1. Technical Field

The present invention relates to a semiconductor device, and more particularly, to a method for manufacturing a semiconductor device, in which a plurality of bottom antireflective coating films are deposited to prevent a standing wave caused by a light source having a short wavelength used in forming a fine pattern.

2. Discussion of the Related Art

Previously, for an exposure process using a light source in the mid ultra violet (MUV) region of the spectrum, only a photoresist film was coated on a wafer before an exposure process.

Recently, a light source such as KrF in a deep ultra violet (DUV) region of the spectrum is used to form a fine pattern on a' wafer. In this case, a bottom anti reflective coating (BARC) film is formed below the photoresist film to solve a problem generated when light enters the wafer below the photoresist film. In case of a DUV having a short wavelength, the DUV is reflected on the wafer through the photoresist film and causes interference with incident light source. For this reason, a standing wave occurs, which impedes the formation of a photoresist film having a uniform profile. That is, the bottom antireflective coating film serves to prevent the light, which has passed through the photoresist film, from being reflected externally.

Hereinafter, a related art method for manufacturing a semiconductor device will be described with reference to the accompanying drawings.

FIG. 1 is a scanning electron microscope (SEM) view illustrating the variation of a photoresist film after exposing the photoresist film on a wafer having no bottom antireflective coating film, and FIG. 2 is a scanning electron microscope (SEM) view illustrating the variation of a photoresist film after exposing the photoresist film on a wafer having a bottom antireflective coating film.

As shown in FIG. 1, in case where no bottom antireflective coating film is formed below a photoresist film, external incident light enters a wafer and is reflected therein. The reflected light interferes with another incident light to cause a standing wave. Therefore, as shown in FIG. 1, the standing wave interferes with the formation of a uniform profile of the photoresist film formed by exposure and developing processes.

Referring now to FIG. 2, a bottom antireflective coating film is formed below the photoresist film so as not to externally reflect the incident light. Thus, a standing wave is avoided. Unlike FIG. 1, it is noted from FIG. 2 that a uniform profile of the photoresist film is formed.

If a bottom antireflective coating film is used, loss of the photoresist film occurs when the bottom antireflective coating film is etched. Considering this loss, the photoresist film should be formed to have a greater thickness. In this case, although the standing wave is avoided, the thicker photoresist film causes other problems.

As shown in FIG. 1, if a standing wave occurs, variation in the critical dimension (CD) may be caused depending on the height or thickness of the photoresist film. If an MUV light source is used to form a pattern having a large design rule (large CD), a variation of CD caused by the standing wave is not a serious problem. However, if a KrF-based light source is used to form a pattern having a small design rule, variation of CD caused by the standing wave may create a serious problem. Therefore, in the exposure process using KrF as a light source, the bottom antireflective coating film is formed below the photoresist film to prevent the standing wave from occurring.

Meanwhile, the bottom antireflective coating film absorbs the light source, which has passed through the photoresist film, to prevent a standing wave from occurring. However, absorbency of the light source by the bottom antireflective coating film depends on the thickness of the bottom antireflective coating film and the types of material layers below the bottom antireflective coating film.

FIG. 3 is a graph illustrating reflexibility of the bottom antireflective coating film depending on its thickness varied per bottom material layers.

Referring to FIG. 3, 'a,' 'b' and 'c' show that different sub-material layers exist below the bottom antireflective coating film.

As shown in FIG. 3, it is noted that the bottom antireflective coating film has minimum reflexibility at a specified thickness. That is, it is noted from the cases 'a,' 'b' and 'c' that reflexibility is varied depending on the material layers below the bottom antireflective coating film.

Therefore, the thickness of the same bottom antireflective coating film is varied depending on the material layers. The thickness of the bottom antireflective coating film will easily be determined if the case 'a' of FIG. 3 is only considered. That is, in 'a' of FIG. 3, the bottom antireflective coating film may be formed at a thickness of about 580 nm showing the lowest reflexibility. However, in this case, the cases 'b' and 'c' are not considered. The case 'c' substantially shows low reflexibility but the case 'b' shows serious reflexibility of 0.2. Therefore, in cases where different material layers are deposited below the bottom antireflective coating film, it is difficult to select the thickness of the bottom antireflective coating film suitable for a proper antireflective effect.

Furthermore, it is noted that a bottom antireflective coating film having a thickness of about 850 nm or greater is required to obtain low reflexibility for all the material layers below the bottom antireflective coating film. However, in this case, another problem may arise in that planarization is not uniform.

The aforementioned method for forming a fine pattern has the following problems.

First, reflexibility of the bottom antireflective coating film is varied depending on types of the bottom material layers. Therefore, if different material layers exist below the bottom antireflective coating film, it is difficult to form the bottom antireflective coating film that meets low reflexibility for all the material layers.

Second, when different material layers exist below the bottom antireflective coating film, the bottom antireflective coating film should be thickly formed to obtain low reflexibility. If the bottom antireflective coating film formed by spin coating is formed to be thick, a problem occurs in that poor planarization may result. If planarization is not good, further problems may occur in later processes such as exposure, developing and etching processes.

SUMMARY

Consistent with the present invention, there is provided a method for manufacturing a semiconductor device, which substantially obviates one or more problems due to limitations and disadvantages of the related art.

Consistent with the invention, as embodied and broadly described herein, a method for manufacturing a semiconductor device includes forming a pattern formation layer on an entire surface of a wafer, forming two or more bottom antireflective coating films on the pattern formation layer, forming a photoresist film pattern on a predetermined region of the bottom antireflective coating films, etching the bottom antireflective coating films using the photoresist film pattern as a mask, forming sidewall spacers at sides of the photoresist film pattern, and etching the pattern formation layer using the sidewall spacers and the photoresist film pattern as masks.

The bottom antireflective coating films may be formed sequentially by performing separate coating and baking processes.

The bottom antireflective coating films may be respectively formed at a thickness of about 100 nm or less.

The bottom antireflective coating films may be formed by spin coating in a state that they are dissolved in a solvent.

It is to be understood that both the foregoing general description and the following detailed description consistent with the present invention are exemplary and explanatory and are intended to provide further explanation consistent with the invention as claimed.

BRIEF DESCRIPTION OF THE DRAWINGS

The accompanying drawings, which are included to provide a further understanding of the invention and are incorporated in and constitute a part of this application, illustrate embodiments consistent with the invention and together with the description serve to explain the principle of the invention. In the drawings.

DETAILED DESCRIPTION

Reference will now be made in detail to the preferred embodiments consistent with the present invention, examples of which are illustrated in the accompanying drawings. Wherever possible, the same reference numbers will be used throughout the drawings to refer to the same or like parts.

Consistent with the present invention, there is provided a method for manufacturing a semiconductor device and, in particular, a method for forming a pattern by etching a predetermined pattern formation layer. A poly gate is used as an example of the pattern. The poly gate may be replaced with various material layers required for etching.

Hereinafter, a method for manufacturing a semiconductor device consistent with the present invention will be described with reference to the accompanying drawings.

FIG. 4A to FIG. 4G are sectional views illustrating process steps of manufacturing a semiconductor device consistent with the present invention.

Figure 1:
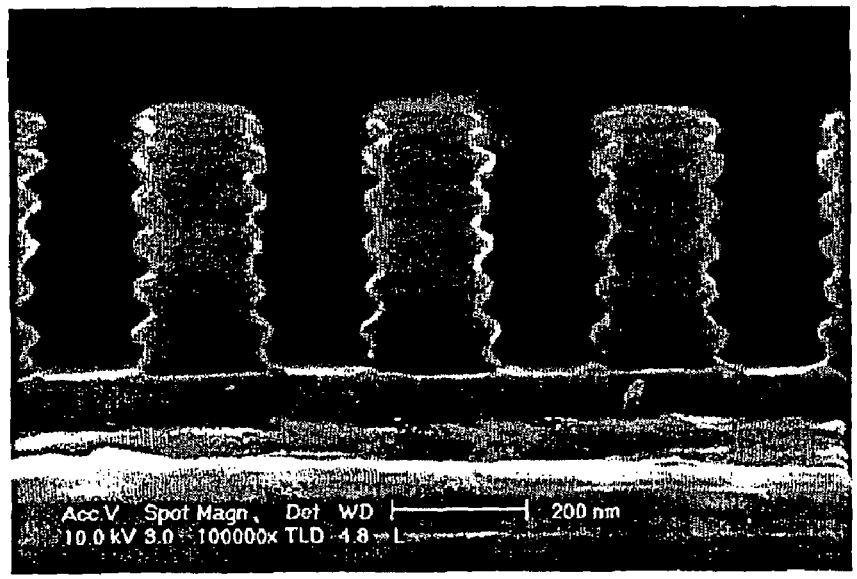
FIG. 1 is a scanning electron microscope (SEM) view illustrating the variation of a photoresist film after exposing the photoresist film on a wafer having no bottom antireflective coating film.
Figure 2:
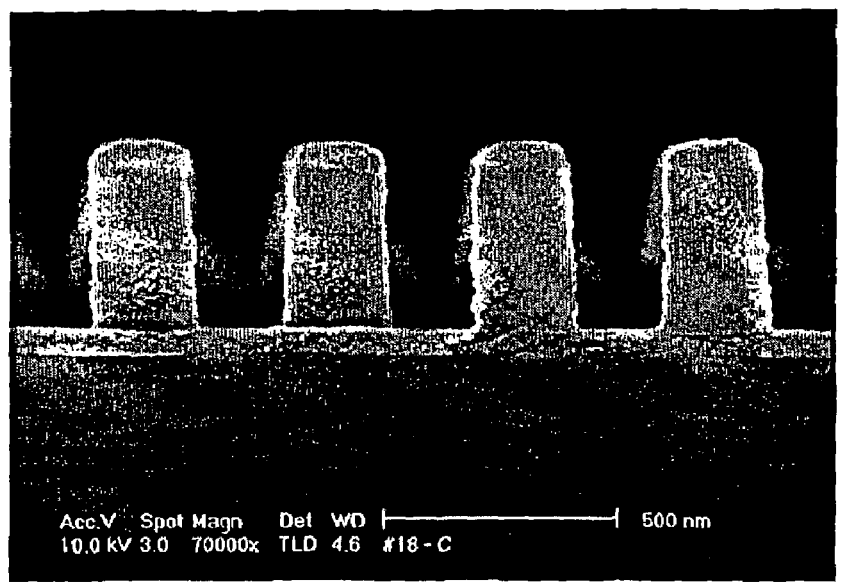
FIG. 2 is a scanning electron microscope (SEM) view illustrating the variation of a photoresist film after exposing the photoresist film on a wafer having a bottom antireflective coating film.
Figure 3:
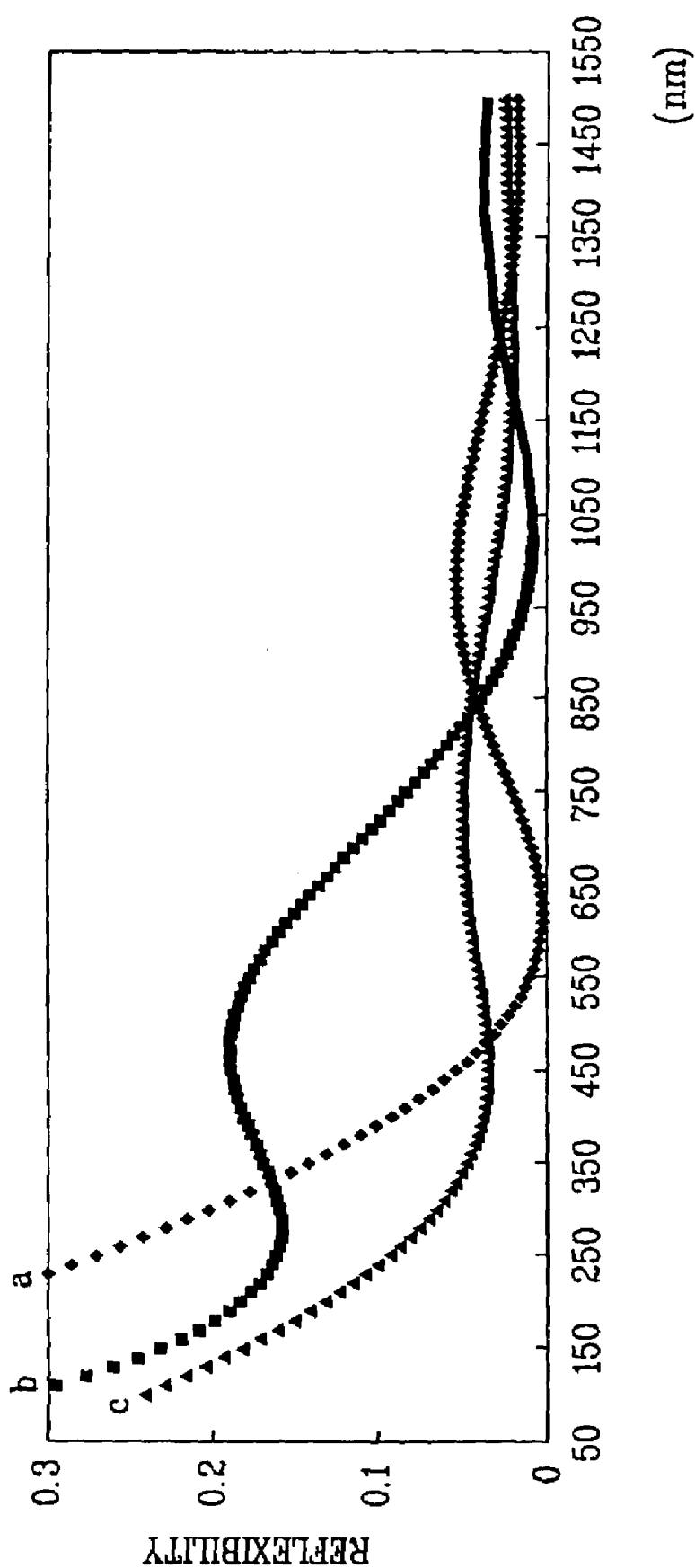
FIG. 3 is a graph illustrating reflexibility of a bottom antireflective coating film depending on its thickness varied per bottom material layers.
Figure 4A:
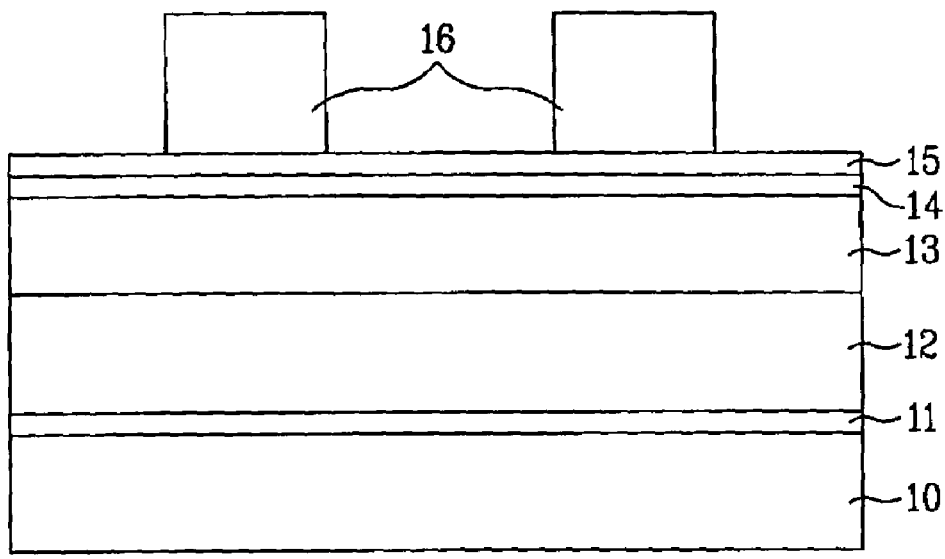
FIG. 4A to FIG. 4G are sectional views illustrating process steps of manufacturing a semiconductor device consistent with the present invention.

First, as shown in FIG. 4A, a gate insulating film 11 is formed on a substrate 10 which may be an entire surface of a wafer.

Subsequently, a polysilicon layer 12, a first insulating film 13, a first bottom antireflective coating film 14, and a second bottom antireflective coating film 15 are sequentially deposited and coated on the gate insulating film 11.

At this time, the first bottom antireflective coating film 14 and the second bottom antireflective coating film 15 exist in a liquefied state in which an antireflective material is dissolved in a solvent, and are coated by a spin coating process. After the first bottom antireflective coating film 14 is coated, baking is performed to cure the first bottom antireflective coating film 14. Thus, the second bottom antireflective coating film 15 is spin-coated on the cured first bottom antireflective coating film 14. In this case, the first bottom antireflective coating film 14 and the second bottom antireflective coating film 15 respectively act as separate films without mixture of materials therebetween. Therefore, a boundary exists between the first bottom antireflective coating film 14 and the second bottom antireflective coating film 15, so that during an exposure process incident light is scattered or trapped while passing through the boundary. Since high energy occurs in the boundary between the first and second bottom antireflective coating films, the light source is trapped therein and the incident light is easily scattered. Such scattering and trapping prevent the incident light from entering a photoresist film pattern. In this case, it is possible to reduce reflexibility of the first and second bottom antireflective coating films 14 and 15 in addition to their unique antireflective effect.

Since the boundary exists between the first and second bottom antireflective coating films 14 and 15 formed by coating and curing through baking, they are thicker than a bottom antireflective coating film simply formed by each thickness of the first and second bottom antireflective coating films.

Although in this embodiment two bottom antireflective coating films are deposited, three or more bottom antireflective coating films may be deposited. In such case, each bottom antireflective coating film may be coated at a thickness of about 100 nm or less.

Subsequently, a photoresist film is spin-coated on the second bottom antireflective coating film 15 and then selectively exposed and developed to form a photoresist film pattern 16.

Figure 4B:
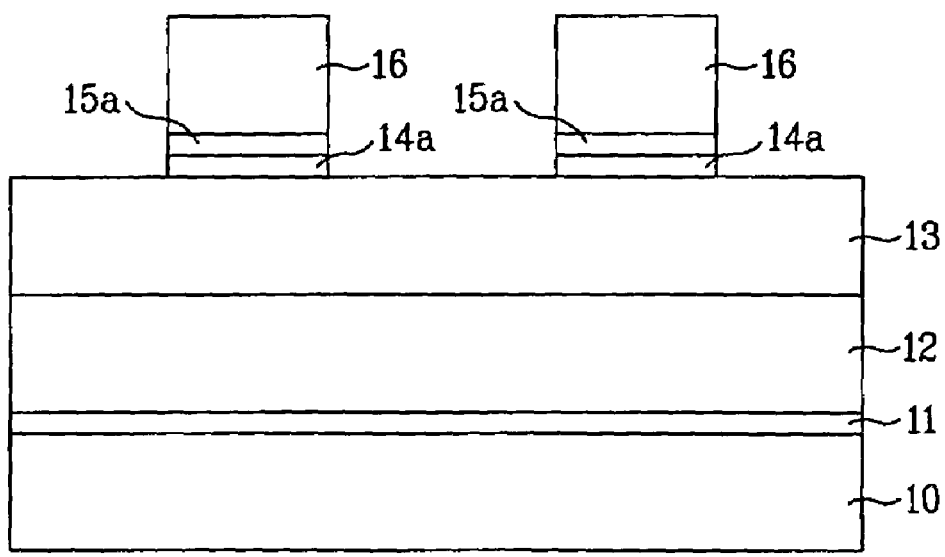

As shown in FIG. 4B, the second bottom antireflective coating film 15 and the first bottom antireflective coating film 14 are etched using the photoresist film pattern 16 as a mask to form a second bottom antireflective coating film pattern 15a and a first bottom antireflective coating film pattern 14a.

Figure 4C:
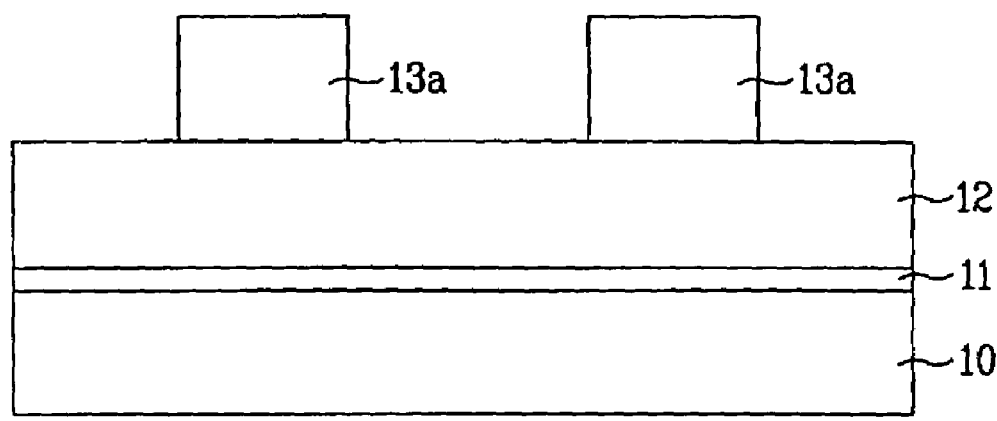

As shown in FIG. 4C, the first insulating film 13 is etched using the photoresist film pattern 16 as a mask to form first insulating film patterns 13a.

Figure 4D:
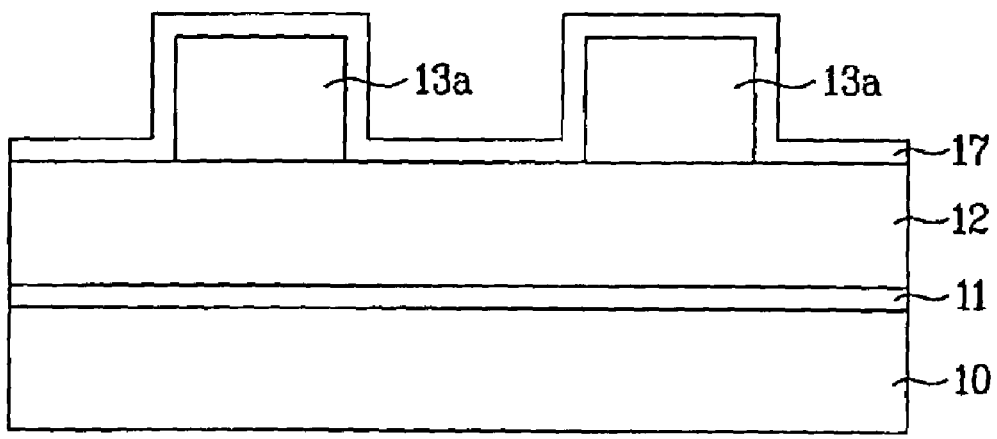

Then, as shown in FIG. 4D, a second insulating film 17 is formed on an entire surface of the polysilicon layer 12 including the first insulating film patterns 13a.

Figure 4E:
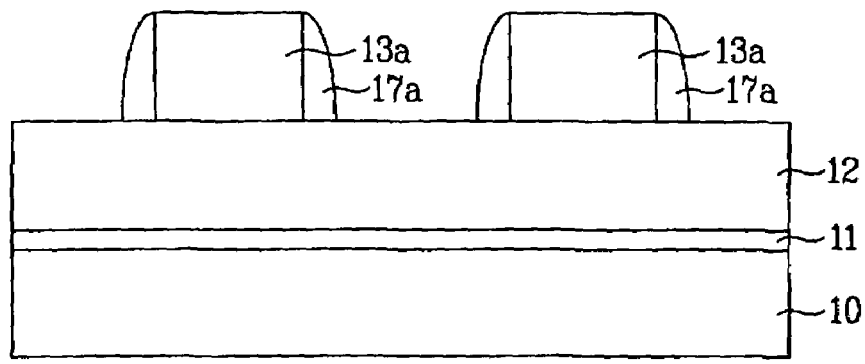

As shown in FIG. 4E, the second insulating film 17 is etched back to remain at sidewalls of the first insulating film patterns 13a, so that sidewall spacers 17a are formed.

Figure 4F:
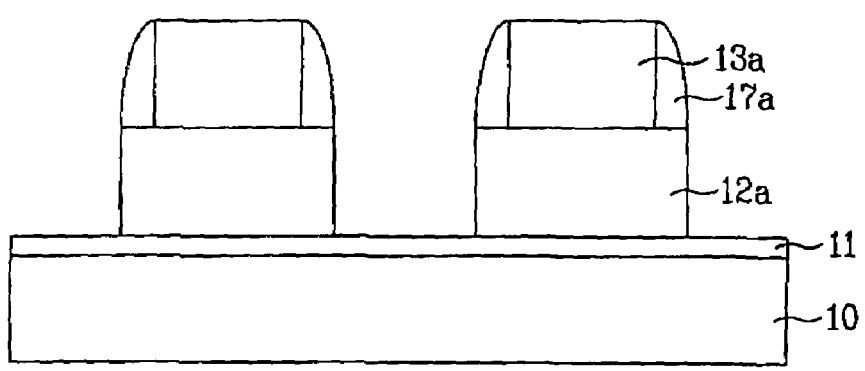

As shown in FIG. 4F, the polysilicon layer 12 is etched using the first insulating film patterns 13a and the sidewall spacers 17a as masks to form polysilicon layer patterns 12a.

Figure 4G:
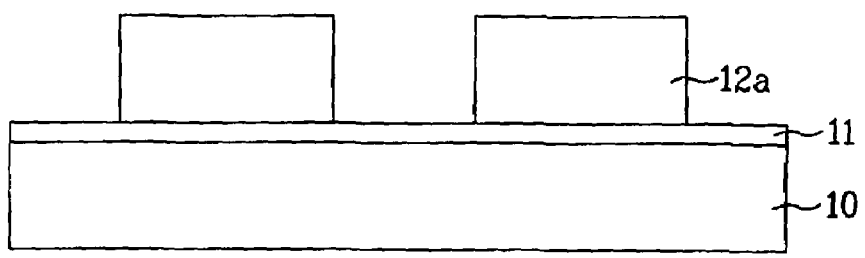

As shown in FIG. 4G, after the first insulating film patterns 13a and the sidewall spacers 17a are removed, the polysilicon layer patterns 12a remain. The remaining polysilicon layer patterns 12a are used as poly gates.

Preferably, the first insulating film patterns 13a and the sidewall spacers 17a are formed of the same insulating material and are removed by a single etching process.

In a method for manufacturing a semiconductor device consistent with the present invention, the bottom antireflective coating films are formed by performing at least two coating and baking processes.

If the bottom antireflective coating films are formed by performing at least two coating and baking processes, the following advantages may be obtained.

First, a greater control of the thickness of the bottom antireflective coating films may be obtained. The possible coating thickness of the bottom antireflective coating films is determined by viscosity. Therefore, if the thickness of the bottom antireflective coating films suitable for minimum reflexibility is too large, another thickness should be set.

If the bottom antireflective coating films are formed by two coating processes consistent with the present invention, the first bottom antireflective coating film first undergoes baking to become a cured film, and the second bottom antireflective coating film is then coated on the cured first bottom antireflective coating film. In this way, if the bottom antireflective coating films are formed by two coating processes, it is possible to increase the thickness of the antireflective coating films during each of the processes.

Second, it may be possible to reduce reflexibility of the bottom antireflective coating films. That is, although the respective bottom antireflective coating films are formed of the same material, they respectively undergo separate coating and baking processes, thereby generating the boundary between the respective bottom antireflective coating films. The incident light source is scattered or trapped while passing through the boundary. In this case, it is possible to reduce reflexibility of the bottom antireflective coating films in addition to their unique antireflective effect. Therefore, it is possible to prevent the generation of a standing wave caused by the light source even though the DUV light source is used for forming a pattern.

As described above, the method for manufacturing a semiconductor device consistent with the present invention has the following advantages.

First, it is possible to have greater control over the thicknesses of the bottom antireflective coating films. That is, since the bottom antireflective coating films are respectively formed by separate coating and baking processes, it is possible to form the bottom antireflective coating films at a thickness which will allow suitable planarization.

Second, it is possible to reduce reflexibility of the bottom antireflective coating films. That is, since a plurality of the bottom antireflective coating films are formed, a boundary between the respective bottom antireflective coating films is formed. The incident light passing through the boundary is scattered or trapped to reduce reflexibility of the bottom antireflective coating films in addition to their unique antireflective effect.

Third, it is possible to reduce the cost. That is, since the plurality of the bottom antireflective coating films are respectively formed of the same material by separate coating and baking processes, it may be possible to form the bottom antireflective coating films having a high antireflective effect without additional material. Also, it is possible to obtain a desired antireflective effect even though the plurality of material layers are deposited below the bottom antireflective coating films.

Finally, the generation of an interfering standing wave is avoided during the exposure process, even when using a DUV light source by means of such improved antireflective effect. Thus, it may be possible to improve a profile of the photoresist film pattern.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a semiconductor device comprising:
   forming a gate insulating film on a surface of a substrate;
   sequentially forming a polysilicon layer and a first insulating film on the gate insulating film;
   forming at least two bottom antireflective coating films on the first insulating film;
   forming a photoresist film pattern on a predetermined region of the bottom antireflective coating films;
   sequentially etching the bottom antireflective coating films and the first insulating film using the photoresist film pattern as a mask to form a first insulating film pattern;
   forming sidewall spacers at sides of the first insulating film pattern; and
   etching the polysilicon layer using the sidewall spacers and the first insulating film pattern as masks;
   wherein the at least two bottom antireflective coating films are formed of the same material by successive coating and baking processes.

2. The method as claimed in claim 1, further comprising:
   sequentially forming the bottom antireflective coating films by performing separate coating and baking processes.

3. The method as claimed in claim 1, further comprising:
   forming the bottom antireflective coating films at a thickness of about 100 nm or less.

4. The method as claimed in claim 1, further comprising:
   forming the bottom antireflective coating films by spin coating a solvent having antireflective material dissolved therein onto the first insulating film.

5. A method for manufacturing a semiconductor device, comprising:
   forming a gate insulating film on a surface of a substrate;
   sequentially forming a polysilicon layer and an insulating film on the gate insulating film;
   coating a first bottom antireflective coating film on the insulating film;
   baking the first bottom antireflective coating film;
   coating a second bottom antireflective coating film on the first bottom antireflective coating film immediately after baking the first bottom antireflective coating film, wherein the first bottom antireflective coating film and the second bottom coating film are formed of the same material;
   forming a photoresist film pattern on a predetermined region of the second bottom antireflective coating film;
   sequentially etching the first and second bottom antireflective coating films and the insulating film using the photoresist film pattern as a mask to form an insulating film pattern;
   forming sidewall spacers at sides of the insulating film pattern; and
   etching the polysilicon layer using the sidewall spacers and the insulating film pattern as masks.

* * * * *